(12) United States Patent
Mizuguchi et al.

(10) Patent No.: US 9,846,362 B2
(45) Date of Patent: Dec. 19, 2017

(54) CONDUCTIVE PASTE AND METHOD OF PRODUCING CONDUCTIVE PATTERN

(71) Applicant: Toray Industries, Inc., Tokyo (JP)

(72) Inventors: Tsukuru Mizuguchi, Otsu (JP); Takuya Nakayama, Otsu (JP); Kazutaka Kusano, Otsu (JP)

(73) Assignee: Toray Industries, Inc. (JP)

( * ) Notice: Subject to any disclaimer, the term of this patent is extended or adjusted under 35 U.S.C. 154(b) by 141 days.

(21) Appl. No.: 14/766,149

(22) PCT Filed: Mar. 13, 2014

(86) PCT No.: PCT/JP2014/056647
§ 371 (c)(1),
(2) Date: Aug. 6, 2015

(87) PCT Pub. No.: WO2014/156677
PCT Pub. Date: Oct. 2, 2014

(65) Prior Publication Data
US 2015/0370167 A1    Dec. 24, 2015

(30) Foreign Application Priority Data

Mar. 29, 2013    (JP) .................................. 2013-071460

(51) Int. Cl.
*G03F 7/038*    (2006.01)
*H01B 1/22*    (2006.01)
(Continued)

(52) U.S. Cl.
CPC .......... *G03F 7/0388* (2013.01); *G03F 7/0047* (2013.01); *G03F 7/168* (2013.01);
(Continued)

(58) Field of Classification Search
None
See application file for complete search history.

(56) References Cited

U.S. PATENT DOCUMENTS

2006/0269695 A1* 11/2006 Daly .................... G11B 5/7013
427/598
2009/0258241 A1 10/2009 Shiraishi et al.
(Continued)

FOREIGN PATENT DOCUMENTS

| CN | 101151307 | 3/2008 |
| CN | 101432081 | 5/2009 |

(Continued)

OTHER PUBLICATIONS

Notification of Reason for Refusal dated Jan. 5, 2017, of corresponding Korean Application No. 10-2015-7023287, along with an English translation.

(Continued)

*Primary Examiner* — Jessee Roe
*Assistant Examiner* — Ngoclan T Mai
(74) *Attorney, Agent, or Firm* — DLA Piper LLP (US)

(57) ABSTRACT

A conductive paste can form a minute conductive pattern having markedly high adhesion and exhibiting conductivity at relatively low temperatures. The conductive paste contains: a compound (A) having a primary amino group, a secondary amino group, and a tertiary amino group; a compound (B) having a carboxyl group; and a conductive filler (C).

15 Claims, 1 Drawing Sheet

(51) Int. Cl.
*G03F 7/16* (2006.01)
*G03F 7/20* (2006.01)
*G03F 7/32* (2006.01)
*G03F 7/40* (2006.01)
*G06F 3/044* (2006.01)
*G03F 7/004* (2006.01)

(52) U.S. Cl.
CPC .................. *G03F 7/20* (2013.01); *G03F 7/32* (2013.01); *G03F 7/40* (2013.01); *G06F 3/044* (2013.01); *H01B 1/22* (2013.01)

(56) References Cited

U.S. PATENT DOCUMENTS

| | | |
|---|---|---|
| 2011/0180764 A1 | 7/2011 | Takahashi et al. |
| 2013/0048920 A1 | 2/2013 | Inagaki et al. |
| 2013/0056687 A1* | 3/2013 | Inagaki ................ B22F 1/0018 252/512 |

FOREIGN PATENT DOCUMENTS

| | | |
|---|---|---|
| CN | 102445846 | 5/2012 |
| JP | 04-253773 A | 9/1992 |
| JP | 10-064333 A | 3/1998 |
| JP | 2003-280195 A | 10/2003 |
| JP | 2004-039379 A | 2/2004 |
| JP | 2004-361352 A | 12/2004 |
| JP | 2007-207567 A | 8/2007 |
| JP | 2010-118168 A | 5/2010 |
| JP | 2011-186019 A | 9/2011 |
| JP | 2011-204515 A | 10/2011 |
| JP | 2012-018783 A | 1/2012 |
| JP | 2012-74174 | 4/2012 |
| KR | 10-2013-0002320 | 1/2013 |
| WO | 2004/061006 A1 | 7/2004 |
| WO | 2011/078141 A1 | 6/2011 |
| WO | 2011/097470 | 8/2011 |
| WO | 2012/067016 A1 | 5/2012 |
| WO | 2012/124438 A1 | 9/2012 |

OTHER PUBLICATIONS

First Office Action dated Jun. 14, 2016, of corresponding Chinese Application No. 201480019233,4, along with an English translation.

* cited by examiner

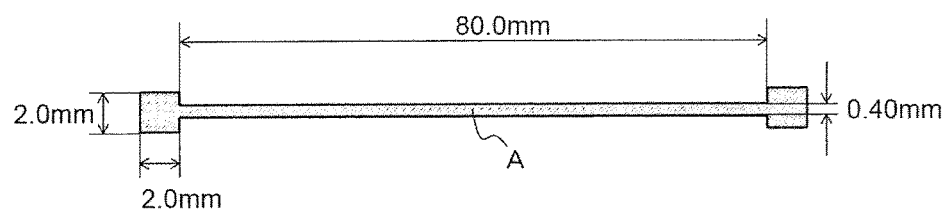

CONDUCTIVE PASTE AND METHOD OF PRODUCING CONDUCTIVE PATTERN

TECHNICAL FIELD

This disclosure relates to a conductive paste and a method of producing a conductive pattern.

BACKGROUND

A so-called "polymer-type" conductive paste with a large amount of silver flakes, copper powder or carbon particles mixed in a resin or an adhesive has come into practical use as a material to form an organic-inorganic composite conductive pattern, the material containing a resin as an organic component and a conductive filler as an inorganic component.

For many of the conductive pastes, a conductive pattern can be obtained by heating and curing a pattern formed by a screen printing method (Japanese Patent Laid-open Publication Nos. 2012-18783 and 2007-207567), but it is difficult to accurately form a conductive pattern of 100 µm or less.

Thus, a conductive paste capable of being acidic-etched (Japanese Patent Laid-open Publication No. 10-64333) and photosensitive curable conductive pastes (Japanese Patent Laid-open Publication No. 2004-361352 and International Publication No. WO 2004/61006) have been developed.

However, conductive pastes capable of being acidic-etched have the problem that the production process is complicated because it is necessary to form a resist layer in formation of a conductive pattern.

Conventional photosensitive curable conductive pastes have the problem that the resulting conductive pattern has low conductivity, and the resulting conductive pattern is fragile, or poor in adhesion to glass or the like.

Thus, it could be helpful to provide a conductive paste capable of forming a fine conductive pattern that has remarkably high adhesion and exhibits conductivity at a relatively low temperature.

SUMMARY

We thus provide a conductive paste, and a method of producing a conductive pattern as set forth in (1) to (9):

(1) A conductive paste which includes: a compound (A) having a primary amino group; a secondary amino group and a tertiary amino group; a compound (B) having a carboxyl group; and a conductive filler (C).
(2) The conductive paste according to (1), wherein the compound (A) is polyethyleneimine.
(3) The conductive paste according to (1) or (2), further including a photopolymerization initiator (D).
(4) The conductive paste according to any one of (1) to (3), wherein the compound (B) has an unsaturated double bond.
(5) The conductive paste according to any one of (1) to (4), wherein the ratio of the compound (A) to the compound (B) is 0.01 to 20% by weight.
(6) The conductive paste according to any one of (1) to (5), wherein the acid value of the compound (B) is 40 to 250 mg KOH/g.
(7) The conductive paste according to any one of (1) to (6), wherein the ratio of conductive filler (C) to the total solid content is 60 to 95% by weight.
(8) A method of producing a conductive pattern, wherein the conductive paste according to any one of (1) to (7) is applied onto a substrate, dried, exposed, developed, and then cured at 100 to 200° C.
(9) An electrostatic capacitance type touch panel including as peripheral wiring the conductive pattern according to (8), wherein the peripheral wiring has a pitch of 50 µm or less.

In our conductive pastes, not only a fine conductive pattern excellent in adhesion is obtained, but also a conductive pattern having a low resistivity can be obtained under low curing temperature conditions.

BRIEF DESCRIPTION OF THE DRAWING

FIG. 1 is a schematic view showing a light transmission pattern of a photomask used for evaluation of a resistivity in examples.

DESCRIPTION OF REFERENCE SIGNS

A: Light transmission part

DETAILED DESCRIPTION

Our conductive pastes include a compound (A) having a primary amino group, a secondary amino group and a tertiary amino group; a compound (B) having a carboxyl group; and a conductive filler (C).

Our methods of producing a conductive pattern apply our conductive pastes onto a substrate, which are then dried, exposed, developed, and cured at 100 to 200° C.

The conductive pattern obtained by the method is a composite of an organic component and an inorganic component, and exhibits conductivity as conductive fillers (c) contained in the conductive paste come into contact with one another due to curing shrinkage during curing.

The compound (A) contained in the conductive paste and having a primary amino group, a secondary amino group and a tertiary amino group (hereinafter, referred to as a "compound (A)") refers to a monomer, oligomer or polymer having at least one primary amino group, secondary amino group and tertiary amino group.

Examples of the compound (A) include 1-(2-aminoethyl)piperazine, metformin hydrochloride, 6-amino-1-methyl-5-nitrosouracil, 6-amino-1-methyluracil, moroxydine hydrochloride, aciclovir, polyethyleneimine, octadecyl isocyanate-modified polyethyleneimine and propylene oxide-modified polyethyleneimine. The compound (A) is preferably polyethyleneimine.

The compound (B) contained in the conductive paste and having a carboxyl group (hereinafter, referred to as a "compound (B)") refers to a monomer, oligomer or polymer having at least one carboxyl group.

Examples of the compound (B) include acryl-based copolymers. The acryl-based copolymer refers to a copolymer containing as a copolymerization component an acryl-based monomer having a carbon-carbon unsaturated double bond (may be referred to as an "unsaturated double bond" hereinafter). Preferably, the compound (B) has an unsaturated double bond.

Examples of the acryl-based monomer having a carbon-carbon unsaturated double bond include acryl-based monomers such as methyl acrylate, acrylic acid, 2-ethylhexyl acrylate, ethyl methacrylate, n-butyl acrylate, iso-butyl acrylate, iso-propane acrylate, glycidyl acrylate, N-methoxymethyl acrylamide, N-ethoxymethyl acrylamide, N-n-butoxymethyl acrylamide, N-isobutoxymethyl acrylamide, butoxytriethylene glycol acrylate, dicyclopentanyl acrylate, dicyclopentenyl acrylate, 2-hydroxyethyl acrylate, isobonyl acrylate, 2-hydroxypropyl acrylate, isodexyl acrylate, isooctyl acrylate, lauryl acrylate, 2-methoxyethyl acrylate, methoxyethylene glycol acrylate, methoxydiethylene glycol acrylate, octafluoropentyl acrylate, phenoxyethyl acrylate, stearyl acrylate, trifluoroethyl acrylate, acrylamide, aminoethyl acrylate, phenyl acrylate, phenoxyethyl acrylate, 1-naphthyl acrylate, 2-naphthyl acrylate, thiophenol acrylate and benzyl mercaptan acrylate; styrenes such as styrene, p-methylstyrene, o-methylstyrene, m-methylstyrene, α-methylstyrene, chloromethylstyrene and hydroxymethylstyrene; epoxy acrylate monomers such as γ-methacryloxypropyltrimethoxysilane, 1-vinyl-2-pyrrolidone, allylated cyclohexyl diacrylate, 1,4-butanediol diacrylate, 1,3-butylene glycol diacrylate, ethylene glycol diacrylate, diethylene glycol diacrylate, triethylene glycol diacrylate, polyethylene glycol diacrylate, dipentaerythritol hexaacrylate, dipentaerythritol monohydroxypentaacrylate, ditrimethylolpropane tetraacrylate, glycerol diacrylate, methoxylated cyclohexyl diacrylate, neopentyl glycol diacrylate, propylene glycol diacrylate, polypropylene glycol diacrylate, triglycerol diacrylate, trimethylolpropane triacrylate, acrylic acid adducts of ethylene glycol diglycidyl ether having a hydroxyl group with an epoxy group ring-opened by an unsaturated acid, acrylic acid adducts of diethylene glycol diglycidyl ether, acrylic acid adducts of neopentyl glycol diglycidyl ether, acrylic acid adducts of glycerin diglycidyl ether, acrylic acid adducts of bisphenol A diglycidyl ether, acrylic acid adducts of bisphenol F and acrylic acid adducts of cresol novolac; and compounds with the acrylic group of the above-mentioned acryl-based monomer replaced by a mathacrylic group.

An alkali-soluble acryl-based copolymer having a carboxyl group is obtained by using as a monomer an unsaturated acid such as an unsaturated carboxylic acid. Examples of the unsaturated acid include acrylic acid, methacrylic acid, itaconic acid, crotonic acid, maleic acid, fumaric acid and vinyl acetate, or acid anhydrides thereof. The acid value of the resulting acryl-based copolymer can be adjusted by increasing or reducing the amount of an unsaturated acid to be used.

When the carboxyl group of the acryl-based copolymer is reacted with a compound having an unsaturated double bond such as glycidyl(meth)acrylate, an alkali-soluble acryl-based copolymer having a reactive unsaturated double bond on the side chain is obtained.

The acid value of the compound (B) is preferably 40 to 250 mg KOH/g for achieving optimum alkali solubility of the compound (B). When the acid value is less than 40 mg KOH/g, the solubility of the soluble moiety may be reduced. On the other hand, when the acid value is more than 250 mg KOH/g, the development allowable range may be narrowed. The acid value of the compound (B) can be measured in accordance with JIS K 0070 (1992).

The added amount of the compound (A) is preferably 0.01 to 20% by weight based on the amount of the compound (B). When the added amount of the compound (A) is 0.01% by weight or more, conductivity is easily exhibited at a low temperature. On the other hand, when the added amount of the compound (A) is 20% by weight or less, patterning characteristics during development is improved.

Examples of the conductive filler (C) contained in the conductive paste include particles of Ag, Au, Cu, Pt, Pb, Sn, Ni, Al, W, Mo, ruthenium oxide, Cr, Ti, carbon and indium, or particles of alloys of these metals, or mixtures of these particles, but Ag, Cu or Au is preferred from the viewpoint of conductivity, with Ag being more preferred from the viewpoint of costs and stability.

The volume average particle size of the conductive filler (C) is preferably 0.1 to 10 μm, more preferably 0.5 to 6 μm. When the volume average particle size is 0.1 μm or more, the contact probability between conductive fillers (C) in the curing step increases, and the resistivity and the breakage probability of the produced conductive pattern decrease. Further, in the exposure step, exposure light can smoothly pass through a coating film obtained by applying the conductive paste so that fine patterning is facilitated. On the other hand, when the volume average particle size is 10 μm or less, the surface smoothness, pattern accuracy, and dimensional accuracy of the produced conductive pattern are improved. The volume average particle size can be measured by a Coulter counter method.

The added amount of the conductive filler (C) is preferably 60 to 95% by weight based on the total solid content in the conductive paste. When the added amount of the conductive filler (C) is 60% by weight or more based on the total solid content, the contact probability between conductive fillers (C) in the curing step increases, and the resistivity and the breakage probability of the produced conductive pattern decrease. On the other hand, when the added amount of the conductive filler (C) is 95% by weight or less based on the total solid content, in the exposure step, exposure light can smoothly pass through a coating film obtained by applying the conductive paste so that fine patterning is facilitated. The total solid content refers to all constituents of the conductive paste excluding the solvent.

Preferably, the conductive paste contains a photopolymerization initiator (D) as necessary. The photopolymerization initiator (D) refers to a compound which is decomposed by absorbing light having a short wavelength such as an ultraviolet ray, or which causes a hydrogen extraction reaction to generate a radical. Examples of the photopolymerization initiator (D) include 1,2-octanedione, 1-[4-(phenylthio)-2-(O-benzoyloxime)], 2,4,6-trimethylbenzoyl-diphenyl-phosphine oxide, bis(2,4,6-trimethylbenzoyl)-phenyl-phosphine oxide, ethanone, 1-[9-ethyl-6-2(2-methylbenzoyl)-9H-carbazole-3-yl]-1-(O-acetyloxime), benzophenone, methyl o-benzoylbenzoate, 4,4'-bis(dimethylamino)benzophenone, 4,4'-bis(diethylamino)benzophenone, 4,4'-dichlorobenzophenone, 4-benzoyl-4'-methyldiphenylketone, dibenzylketone, fluorenone, 2,2'-diethoxyacetophenone, 2,2-dimethoxy-2-phenylacetophenone, 2-hydroxy-2-methylpropiophenone, p-t-butyldichloroacetophenone, thioxanthone, 2-methylthioxanthone, 2-chlorothioxanthone, 2-isopropylthioxanthone, diethylthioxanthone, benzyl, benzyl dimethyl ketal, benzyl-β-methoxyethyl acetal, benzoin, benzoin methyl ether, benzoin butyl ether, anthraquinone, 2-t-butylanthraquinone, 2-amylanthraquinone, β-chloroanthraquinone, anthrone, benzanthrone, dibenzosuberone, methylene anthrone, 4-azidebenzalacetophenone, 2,6-bis(p-azidebenzylidene)cyclohexanone, 6-bis(p-azidebenzylidene)-4-methylcyclohexanone, 1-phenyl-1,2-butanedione-2-(o-methoxycarbonyl)oxime, 1-phenyl-propanedione-2-(o-ethoxycarbonyl)oxime, 1-phenyl-propanedione-2-(o-benzoyl)oxime, 1,3-diphenyl-propanetrione-2-(o-ethoxycarbonyl)oxime, 1-phenyl-3-ethoxy-propanetrione-2-(o-benzoyl)oxime, Michler's ketone, 2-methyl-[4-(methylthio)phenyl]-2-morpholino-1-propanone, naphthalenesulfonyl chloride, quinolinesulfonyl chloride, N-phenylthioacridone, 4,4'-azobisisobutyronitrile, diphenyl disulfide, benzothiazole disulfide, triphenylphosphine, camphor quinone, 2,4-diethylthioxanthone, isopropylthioxanthone, carbon tetrabromide, tribromophenylsulfone, benzoyl peroxide, and combinations of a photo-reductive pigment such as eosin and methylene blue, and a reducing agent such as ascorbic acid and triethanolamine.

The added amount of the photopolymerization initiator (D) is preferably 0.05 to 30% by weight, more preferably 5 to 20% by weight based on the amount of the compound (B). When the added amount of the photopolymerization initiator (D) is 5% by weight or more, the curing density of an exposed part of the conductive paste increases so that the residual film ratio after developing increases. On the other hand, when the added amount of the photopolymerization initiator (D) is 20% by weight or less, excessive absorption of light at the upper part of a coating film obtained by applying the conductive paste is suppressed. As a result, the produced conductive pattern is inhibited from being reversely tapered to reduce adhesion to the substrate.

The conductive paste may contain a sensitizer along with the photopolymerization initiator (D).

Examples of the sensitizer include 2,4-diethylthioxanthone, isopropylthioxanthone, 2,3-bis(4-diethylaminobenzal)cyclopentanone, 2,6-bis(4-dimethylaminobenzal)cyclohexanone, 2,6-bis(4-dimethylaminobenzal)-4-methylcyclohexanone, Michler's ketone, 4,4-bis(diethylamino)benzophenone, 4,4-bis(dimethylamino)chalcone, 4,4-bis(diethylamino)chalcone, p-dimethylaminocinnamylideneindanone, p-dimethylaminobenzylideneindanone, 2-(p-dimethylaminophenylvinylene)isonaphthothiazole, 1,3-bis(4-dimethylaminophenylvinylene)isonaphthothiazole, 1,3-bis(4-dimethylaminobenzal)acetone, 1,3-carbonylbis(4-diethylaminobenzal)acetone, 3,3-carbonylbis(7-diethylaminocoumarin), N-phenyl-N-ethylethanolamine, N-phenylethanolamine, N-tolyldiethanolamine, isoamyl dimethylaminobenzoate, isoamyl diethylaminobenzoate, 3-phenyl-5-benzoylthiotetrazole, and 1-phenyl-5-ethoxycarbonylthiotetrazole.

The added amount of the sensitizer is preferably 0.05 to 10% by weight, more preferably 0.1 to 10% by weight based on the amount of the compound (B). When the added amount of the sensitizer is 0.1% by weight or more, photosensitivity is sufficiently improved. On the other hand, when the added amount of the sensitizer is 10% by weight or less, excessive absorption of light at the upper part of a coating film obtained by applying the conductive paste is suppressed. As a result, the produced conductive pattern is inhibited from being reversely tapered to reduce adhesion to the substrate.

The conductive paste may contain a solvent. Examples of the solvent include N,N-dimethylacetamide, N,N-dimethylformamide, N-methyl-2-pyrrolidone, dimethyl imidazolidinone, dimethyl sulfoxide, diethylene glycol monoethyl ether, diethylene glycol monoethyl ether acetate (hereinafter, referred to as "DMEA"), diethylene glycol monomethyl ether acetate, γ-butyrolactone, ethyl lactate, 1-methoxy-2-propanol, 1-ethoxy-2-propanol, ethylene glycol mono-n-propyl ether, diacetone alcohol, tetrahydrofurfuryl alcohol and propylene glycol monomethyl ether acetate.

The conductive paste may contain additives such as a non-photosensitive polymer having no unsaturated double bond in the molecule, or a plasticizer, a leveling agent, a surfactant, a silane coupling agent, an antifoaming agent and a pigment as long as the desired characteristics of the conductive paste are not impaired.

Examples of the non-photosensitive polymer include epoxy resins, novolac resins, phenol resins, polyimide precursors and ring-closed polyimides.

Examples of the plasticizer include dibutyl phthalate, dioctyl phthalate, polyethylene glycol, and glycerin.

Examples of the leveling agent include special vinyl-based polymers and special acryl-based polymers.

Examples of the silane coupling agent include methyltrimethoxysilane, dimethyldiethoxysilane, phenyltriethoxysilane, hexamethyldisilazane, 3-methacryloxypropyltrimethoxysilane, 3-glycidoxypropyltrimethoxysilane, and vinyltrimethoxysilane.

The conductive paste is produced using, for example, a disperser or a kneader such as a three-roll mill, a ball mill, and a planetary ball mill.

A method of producing a conductive pattern using the conductive paste will now be described. To produce a conductive pattern, first the conductive paste is applied onto a substrate to obtain a coating film, and the obtained coating film is dried to volatilize a solvent. Thereafter, the coating film is exposed through a pattern forming mask, and the exposed coating film is developed to form a desired pattern on the substrate. The obtained pattern is then cured at 100 to 200° C. to obtain a conductive pattern. The curing temperature is preferably 120 to 180° C. When the curing temperature is lower than 100° C., the volume shrinkage amount of the resin does not increase, and thus the resistivity cannot be reduced. On the other hand, when the heating temperature is higher than 200° C., a conductive pattern cannot be formed on a material such as a substrate which has low heat resistance.

Examples of the substrate include polyethylene terephthalate films (hereinafter, referred to as a "PET film"), polyimide films, polyester films, aramid films, epoxy resin substrates, polyether imide resin substrates, polyether ketone resin substrates, polysulfone-based resin substrates, glass substrates, silicon wafers, alumina substrates, aluminum nitride substrates, silicon carbide substrates, decorative layer-formed substrates and insulating layer-formed substrates.

Examples of the method of applying the conductive paste to the substrate include spin coating by a spinner, spray coating, roll coating, screen printing, and coating by a blade coater, a die coater, a calendar coater, a meniscus coater, or a bar coater. The film thickness of the coating film obtained may be appropriately determined according to, for example, a coating method, or a total solid concentration or a viscosity of the conductive paste, but the film thickness after drying is preferably 0.1 to 50 μm. The film thickness can be measured using a probe type step profiler such as SURFCOM (registered trademark) 1400 (manufactured by TOKYO SEIMITSU CO., LTD.). More specifically, the film thickness is measured at randomly selected three positions using a probe type step profiler (measurement length: 1 mm; scanning speed: 0.3 mm/sec), and an average value thereof is defined as a film thickness.

Examples of the method of volatilizing and removing a solvent by drying the obtained coating film include heating/drying by an oven, a hot plate, an infrared ray or the like and vacuum drying. The heating temperature is preferably 50 to 180° C., and the heating time is preferably 1 minute to several hours.

The dried coating film is exposed by a photolithography method. The light source for exposure is preferably the i ray (365 nm), the h ray (405 nm) or the g ray (436 nm) of a mercury lamp.

The exposed coating film is developed using a developer, and an unexposed part is dissolved and removed to obtain a desired pattern. Examples of the developer to be used for alkali development include aqueous solutions of tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine, and hexamethylenediamine, and to these aqueous solutions may be added a polar solvent such as N-methyl-2-pyrrolidone, N,N-dimethylformamide, N,N-dimethylacetamide, dimethyl sulfoxide, and γ-butyrolactone, an alcohol such as methanol, ethanol, and isopropanol, an ester such as ethyl lactate and propylene glycol monomethyl ether acetate, a ketone such as cyclopentanone, cyclohexanone, isobutyl ketone, and methyl isobutyl ketone, or a surfactant.

Examples of the developer to be used for organic development include polar solvents such as N-methyl-2-pyrrolidone, N-acetyl-2-pyrrolidone, N,N-dimethylacetamide, N,N-dimethylformamide, dimethyl sulfoxide, and hexamethylphosphortriamide, and mixed solutions of these polar solvents and methanol, ethanol, isopropyl alcohol, xylene, water, methyl carbitol or ethyl carbitol.

Examples of the development method include a method in which a developer is sprayed on a coating film surface while a substrate is left at rest or rotated, a method in which a substrate is immersed in a developer, and a method in which a substrate is immersed in a developer while an ultrasonic wave is applied thereto.

The pattern obtained by development may be subjected to a rinsing treatment with a rinsing liquid. Examples of the rinsing liquid include water, and aqueous solutions obtained by adding to water an alcohol such as ethanol and isopropyl alcohol, or an ester such as ethyl lactate and propylene glycol monomethyl ether acetate.

Examples of the method of curing the obtained pattern include heating/drying by an oven, an inert oven, a hot plate, an infrared ray or the like and vacuum drying.

A conductive pattern produced using the conductive paste is suitably used as peripheral wiring for a touch panel. Examples of the type of touch panel include a resistive film type, an optical type, an electromagnetic induction type, and an electrostatic capacitance type, and the conductive paste is more suitably used in the electrostatic capacitance type touch panel because this type of touch panel requires particularly fine wiring. In a touch panel including the conductive pattern as peripheral wiring of the touch panel, the peripheral wiring having a pitch (wiring width+inter-wiring width) of 50 μm or less, the frame width can be decreased to widen a view area.

EXAMPLES

Hereinafter, our pastes and methods will be described more in detail by way of examples and comparative examples, but the disclosure is not limited to these examples.

Evaluation methods used in examples and comparative examples are as follows.

Method of Evaluation of Patterning Characteristics

The conductive paste was applied onto a PET film such that the dried film had a film thickness of 7 μm, and the obtained coating film was dried in a drying oven at 100° C. for 5 minutes. The dried coating film was exposed via a photomask having nine units having different L/S values, with one unit including a group of lines arranged with a fixed line-and-space (hereinafter, referred to as L/S), namely a light transmission pattern, and developed to obtain nine patterns having different L/S values. Thereafter, the obtained nine patterns were each cured in a drying oven at 140° C. for 30 minutes to obtain nine conductive patterns having different L/S values. The L/S values of the units of the photomask were set to 500/500, 250/250, 100/100, 50/50, 40/40, 30/30, 25/25, 20/20 and 15/15 (each showing a line width (μm)/interval (μm)). The obtained conductive patterns were observed with an optical microscope to confirm a pattern which was free from residues between patterns and free from pattern peeling and had the smallest L/S value, and the L/S value was defined as a development-enabling L/S value. Exposure was performed over the entire line at an exposure amount of 150 mJ/cm² (in terms of a wavelength of 365 nm) using exposure equipment (PEM-6M manufactured by UNION OPTICAL CO., LTD.), and development was performed by immersing a substrate in a 0.2 wt % Na$_2$CO$_3$ solution for 30 seconds, and then subjecting the substrate to a rinsing treatment with ultrapure water.

Method of Evaluation of Resistivity

The following operations were carried out in accordance with whether a photopolymerization initiator (D) was contained or not:

Where the photopolymerization initiator (D) was not contained:

The pattern shown in FIG. 1 was applied onto a PET film by a screen printing method, dried in a drying oven at 100° C. for 5 minutes, and then cured in a drying oven at 140° C. for 30 minutes to obtain a conductive pattern for measurement of a resistivity. The obtained conductive pattern had a line width of 0.400 mm and a line length of 80 mm.

Where the photopolymerization initiator (D) was contained:

The conductive paste was applied onto a PET film such that the dried film had a film thickness of 7 μm, and the obtained coating film was dried in a drying oven at 100° C. for 5 minutes. The coating film after drying was exposed through a photomask having a light transmission part A with a pattern as shown in FIG. 1, and was developed to obtain a pattern. Thereafter, the obtained pattern was cured in a drying oven at 140° C. for 30 minutes to obtain a conductive pattern for measurement of a resistivity. The obtained conductive pattern had a line width of 0.400 mm and a line length of 80 mm.

Conditions for exposure and development were the same as those in the method of evaluation of patterning characteristics. The ends of the obtained conductive pattern for measurement of a resistivity were connected through an ohmmeter to measure a resistance value, and a resistivity was calculated based on Formula (1):

$$\text{Resistivity} = \text{resistance value} \times \text{film thickness} \times \text{line width} / \text{line length} \quad (1).$$

The line width is an average value obtained by observing line widths at three random positions with an optical microscope, and analyzing image data.

Method of Evaluation of Adhesion with ITO

The conductive paste was applied onto a PET film with ITO "ELECRYSTA" (registered trademark) V270L-TFS (manufactured by NITTO DENKO CORPORATION) such that the dried film had a film thickness of 7 μm, and the obtained coating film was dried in a drying oven at 100° C. for 5 minutes, and then exposed over the entire surface thereof. Conditions for exposure and development were the same as those in the method of evaluation of patterning characteristics. Thereafter, the obtained pattern was cured in a drying oven at 140° C. for 30 minutes, a cut was then made in the form of 10×10 squares with a width of 1 mm, and the film was placed in a thermo-hygrostat bath SH-661 (manufactured by ESPEC Corp.) at 85° C. and 85% RH for 240 hours. A cellophane tape (manufactured by NICHIBAN CO., LTD.) was attached at the entire location of the squares of the sample taken out from the bath, and peeled off, and the number of remaining squares was counted.

Materials used in examples and comparative examples are as follows:

Compound (A)

1-(2-aminoethyl)piperazine
6-amino-1-methyluracil
EPOMIN (registered trademark) SP-012 (polyethyleneimine manufactured by Nippon Shokubai Co., Ltd.)
EPOMIN (registered trademark) SP-003 (polyethyleneimine manufactured by Nippon Shokubai Co., Ltd.)
EPOMIN (registered trademark) SP-200 (polyethyleneimine manufactured by Nippon Shokubai Co., Ltd.)

Compound (B)

Synthesis Example 1

Copolymerization ratio (weight base): ethyl acrylate (hereinafter, referred to as "EA")/2-ethylhexyl methacrylate (hereinafter, referred to as "2-EHMA")/styrene (hereinafter, referred to as "St")/glycidyl methacrylate (hereinafter, referred to as "GMA")/acrylic acid (hereinafter, referred to as "AA")=20/40/20/5/15.

150 g of DMEA was added in a reaction vessel in a nitrogen atmosphere, and the temperature was elevated to 80° C. using an oil bath. To this was added dropwise for 1 hour a mixture including 20 g of EA, 40 g of 2-EHMA, 20 g of St, 15 g of AA, 0.8 g of 2,2'-azobisisobutyronitrile and 10 g of DMEA. After completion of the dropwise addition, further a polymerization reaction was carried out for 6 hours. Thereafter, 1 g of hydroquinone monomethyl ether was added to stop the polymerization reaction. Subsequently, a mixture including 5 g of GMA, 1 g of triethyl benzyl ammonium chloride and 10 g of DMEA was added dropwise for 0.5 hours. After completion of the dropwise addition, further an addition reaction was carried out for 2 hours. The obtained reaction solution was refined with methanol to remove unreacted impurities, and dried under vacuum for 24 hours to obtain a compound (B-1) having an unsaturated double bond. The acid value of the obtained compound (B-1) was 103 mg KOH/g.

Synthesis Example 2

Copolymerization ratio (weight basis): tricyclodecane dimethanol diacrylate (IRR 214-K; manufactured by Daicel-Cytec Co., Ltd.)/modified bisphenol A diacrylate (EBECRYL 150; manufactured by Daicel-Cytec Co., Ltd.)/St/AA=25/40/20/15.

150 g of DMEA was added in a reaction vessel in a nitrogen atmosphere, and the temperature was elevated to 80° C. using an oil bath. To this was added dropwise for 1 hour a mixture including 25 g of IRR 214-K, 40 g of EBECRYL 150, 20 g of St, 15 g of AA, 0.8 g of 2,2'-azobisisobutyronitrile and 10 g of DMEA. After completion of the dropwise addition, further a polymerization reaction was carried out for 6 hours. Thereafter, 1 g of hydroquinone monomethyl ether was added to stop the polymerization reaction. The obtained reaction solution was refined with methanol to remove unreacted impurities, and dried under vacuum for 24 hours to obtain a compound (B-2) having a carboxyl group. The acid value of the obtained compound (B-2) was 89 mg KOH/g.

Synthesis Example 3

Copolymerization ratio (weight base): ethylene oxide-modified bisphenol A diacrylate (FA-324A; manufactured by Hitachi Chemical Co., Ltd.)/EA/GMA/AA=50/10/5/15.

150 g of DMEA was added in a reaction vessel in a nitrogen atmosphere, and the temperature was elevated to 80° C. using an oil bath. To this was added dropwise for 1 hour a mixture including 50 g of ethylene oxide-modified bisphenol A diacrylate, 20 g of EA, 15 g of AA, 0.8 g of 2,2'-azobisisobutyronitrile and 10 g of DMEA. After completion of the dropwise addition, further a polymerization reaction was carried out for 6 hours. Thereafter, 1 g of hydroquinone monomethyl ether was added to stop the polymerization reaction. Subsequently, a mixture including 5 g of GMA, 1 g of triethyl benzyl ammonium chloride and 10 g of DMEA was added dropwise for 0.5 hours. After completion of the dropwise addition, further an addition reaction was carried out for 2 hours. The obtained reaction solution was refined with methanol to remove unreacted impurities, and dried under vacuum for 24 hours to obtain a compound (B-3) having a carboxyl group and an unsaturated double bond. The acid value of the obtained compound (B-3) was 96 mg KOH/g.

Synthesis Example 4

Copolymerization ratio (weight basis): difunctional epoxy acrylate monomer (Epoxy Ester 3002A; KYOEISHA CHEMICAL Co., LTD.)/difunctional epoxy acrylate monomer (Epoxy Ester 70 PA; manufactured by KYOEISHA CHEMICAL Co., LTD.)/GMA/St/AA=20/40/5/20/15.

150 g of DMEA was added in a reaction vessel in a nitrogen atmosphere, and the temperature was elevated to 80° C. using an oil bath. To this was added dropwise for 1 hour a mixture including 20 g of Epoxy Ester 3002A, 40 g of Epoxy Ester 70PA, 20 g of St, 15 g of AA, 0.8 g of 2,2'-azobisisobutyronitrile and 10 g of DMEA. After completion of the dropwise addition, further a polymerization reaction was carried out for 6 hours. Thereafter, 1 g of hydroquinone monomethyl ether was added to stop the polymerization reaction. Subsequently, a mixture including 5 g of GMA, 1 g of triethyl benzyl ammonium chloride and 10 g of DMEA was added dropwise for 0.5 hours. After completion of the dropwise addition, further an addition reaction was carried out for 2 hours. The obtained reaction solution was refined with methanol to remove unreacted impurities, and dried under vacuum for 24 hours to obtain a compound (B-4) having a carboxyl group and an unsaturated double bond. The acid value of the obtained compound (B-4) was 101 mg KOH/g.

Conductive Filler (C)

Ag particles having a volume average particle size of 1 μm: The volume average particle size was measured using a dynamic light scattering particle size distribution analyzer manufactured by HORIBA, Ltd.

Photopolymerization Initiator (D)

IRGACURE (registered trademark) 369; manufactured by Ciba Japan K.K. (may be referred to as "IRGC 369" hereinafter).

Monomer
  LIGHT ACRYLATE BP-4EA; manufactured by KYOE-ISHA CHEMICAL Co., LTD.
Solvent
  DMEA; manufactured by Tokyo Chemical Industry Co., Ltd.

Example 1

0.50 g of EPOMIN (registered trademark) SP-012 as the compound (A), 10.0 g of the compound (B-1), 0.50 g of IRGACURE (registered trademark) 369 as the photopolymerization initiator (D) and 5.0 g of DMEA as 5.0 g of the solvent were added in a 100 mL clean bottle, and mixed by a rotating and revolving mixer "Awatori Rentaro" (registered trademark) (ARE-310 manufactured by THINKY CORPORATION) to obtain 16.0 g of a resin solution (solid content: 68.8% by weight).

16.0 g of the obtained resin solution and 62.3 g of Ag particles as the conductive filler (C) were mixed together, and the mixture was kneaded using a three-roll mill (EXAKT M-50 manufactured by EXAKT) to obtain 78.3 g of a conductive paste.

The obtained conductive paste was used to prepare a conductive pattern, and the conductive pattern was evaluated for patterning characteristics, the resistivity and adhesion with ITO. The conductive pattern had a development-enabling L/S value of 15/15 μm, and it was thus confirmed that proper pattern processing was performed. The resistivity of the conductive pattern was $3.4 \times 10^{-5}$ Ωcm.

Examples 2 to 11

Conductive pastes having compositions as shown in Table 1 were produced in the same manner as in Example 1. Results of performing evaluations in the same manner as in Example 1 are shown in Table 2.

Comparative Examples 1 and 2

Conductive pastes having compositions as shown in Table 1 were produced in the same manner as in Example 1. Results of performing evaluations in the same manner as in Example 1 are shown in Table 2.

For the conductive paste of each of Examples 1 to 11, a conductive pattern excellent in patterning characteristics, resistivity and adhesion with ITO was formed, but a conductive pattern formed from the conductive paste of each of Comparative Examples 1 and 2 had reduced adhesion with ITO at a high temperature and high humidity.

TABLE 1

| | Compound (A) having a primary amino group, a secondary amino group and a tertiary amino group | | Conductive filler (C) | | | Photo-polymerization initiator (D) | | Monomer | | Solvent | |
|---|---|---|---|---|---|---|---|---|---|---|---|
| | Type | Added amount based on the amount of compound (B) (% by weight) | Compound (B) having a carboxyl group Type | Added amount based on the total solid content (% by mass) | Type | Average particle size (μm) | Type | Added amount based on the amount of compound (B) (% by weight) | Type | Added amount based on the amount of compound (B) (% by weight) | Type | Added amount based on the amount of compound (B) (% by weight) |
| Example 1 | EPOMIN SP-012 | 5 | B-1 | 85 | Ag | 1.0 | IRGC 369 | 5 | — | — | DMEA | 50 |
| Example 2 | EPOMIN SP-012 | 5 | B-1 | 85 | Ag | 1.0 | — | — | — | — | DMEA | 50 |
| Example 3 | EPOMIN SP-012 | 5 | B-2 | 85 | Ag | 1.0 | — | — | — | — | DMEA | 50 |
| Example 4 | 1-(2-aminoethyl) Piperazine | 5 | B-2 | 85 | Ag | 1.0 | IRGC 369 | 5 | BP-4EA | 20 | DMEA | 50 |
| Example 5 | 6-amino-1-Methyluracil | 5 | B-3 | 85 | Ag | 1.0 | IRGC 370 | 5 | BP-4EA | 20 | DMEA | 50 |
| Example 6 | EPOMIN SP-003 | 5 | B-3 | 85 | Ag | 1.0 | IRGC 371 | 5 | BP-4EA | 20 | DMEA | 50 |
| Example 7 | 6-amino-1-Methyluracil | 5 | B-3 | 85 | Ag | 1.0 | IRGC 372 | 5 | BP-4EA | 20 | DMEA | 50 |
| Example 8 | EPOMIN SP-200 | 10 | B-4 | 85 | Ag | 1.0 | IRGC 373 | 5 | BP-4EA | 20 | DMEA | 50 |
| Example 9 | 1-(2-aminoethyl) Piperazine | 5 | B-4 | 85 | Ag | 1.0 | IRGC 374 | 5 | — | — | DMEA | 50 |
| Example 10 | EPOMIN SP-003 | 5 | B-4 | 85 | Ag | 1.0 | IRGC 375 | 5 | BP-4EA | 20 | DMEA | 50 |
| Example 11 | 6-amino-1-Methyluracil | 5 | B-4 | 85 | Ag | 1.0 | IRGC 376 | 5 | — | — | DMEA | 50 |
| Example 12 | 6-amino-1-methyl-5-nitrosouracil | 5 | B-4 | 85 | Ag | 1.0 | IRGC 377 | 5 | — | — | DMEA | 50 |
| Example 13 | Moroxydine hydrochloride | 5 | B-4 | 85 | Ag | 1.0 | IRGC 378 | 5 | — | — | DMEA | 50 |
| Example 14 | Aciclovir | 5 | B-4 | 85 | Ag | 1.0 | IRGC 369 | 5 | — | — | DMEA | 50 |
| Comparative Example 1 | — | — | B-1 | 85 | Ag | 1.0 | — | — | BP-4EA | 20 | DMEA | 50 |
| Comparative Example 2 | — | — | B-4 | 85 | Ag | 1.0 | IRGC 369 | 5 | BP-4EA | 20 | DMEA | 50 |

TABLE 2

| | Preparation conditions | | Characteristic of conductive pattern | | |
|---|---|---|---|---|---|
| | Substrate | Curing conditions | Development-enabling L/S (μm) | Resistivity (Ωcm) | Adhesion with ITO Number of remaining squares |
| Example 1 | PET film | 140° C. × 30 minutes | 15/15 | $3.4 \times 10^{-5}$ | 100 |
| Example 2 | PET film | 140° C. × 30 minutes | — | $3.1 \times 10^{-5}$ | 95 |
| Example 3 | PET film | 140° C. × 30 minutes | — | $3.3 \times 10^{-5}$ | 97 |
| Example 4 | PET film | 140° C. × 30 minutes | 20/20 | $4.8 \times 10^{-5}$ | 100 |
| Example 5 | PET film | 140° C. × 30 minutes | 15/15 | $5.1 \times 10^{-5}$ | 100 |
| Example 6 | PET film | 140° C. × 30 minutes | 15/15 | $3.2 \times 10^{-5}$ | 100 |
| Example 7 | PET film | 140° C. × 30 minutes | 15/15 | $5.5 \times 10^{-5}$ | 100 |
| Example 8 | PET film | 140° C. × 30 minutes | 15/15 | $2.9 \times 10^{-5}$ | 100 |
| Example 9 | PET film | 140° C. × 30 minutes | 15/15 | $4.8 \times 10^{-5}$ | 100 |
| Example 10 | PET film | 140° C. × 30 minutes | 15/15 | $3.1 \times 10^{-5}$ | 100 |
| Example 11 | PET film | 140° C. × 30 minutes | 15/15 | $5.2 \times 10^{-5}$ | 100 |
| Example 12 | PET film | 140° C. × 30 minutes | 15/15 | $3.8 \times 10^{-5}$ | 100 |
| Example 13 | PET film | 140° C. × 30 minutes | 15/15 | $4.1 \times 10^{-5}$ | 100 |
| Example 14 | PET film | 140° C. × 30 minutes | 15/15 | $4.2 \times 10^{-5}$ | 100 |
| Comparative Example 1 | PET film | 140° C. × 30 minutes | — | >1.0 | 3 |
| Comparative Example 2 | PET film | 140° C. × 30 minutes | 15/15 | 0.15 | 14 |

INDUSTRIAL APPLICABILITY

The conductive paste can be suitably used for producing a conductive pattern such as peripheral wiring for a touch panel.

The invention claimed is:

1. A conductive paste comprising:
   a compound (B) having a carboxyl group;
   0.01 to 20 wt % of a compound (A) having a primary amino group, a secondary amino group and a tertiary amino group, based on the weight of compound (B); and
   a conductive filler (C).

2. The conductive paste according to claim 1, wherein the compound (A) is polyethyleneimine.

3. The conductive paste according to claim 1, further comprising a photopolymerization initiator (D).

4. The conductive paste according to claim 1, wherein the compound (B) has an unsaturated double bond.

5. The conductive paste according to, claim 1, wherein acid value of the compound (B) is 40 to 250 mg KOH/g.

6. The conductive paste according to claim 1, wherein an amount of conductive filler (C) to a total solid content is 60 to 95 wt %.

7. A method of producing a conductive pattern comprising applying the conductive paste according to claim 1 onto a substrate, drying the paste, exposing a selected portion of the paste to light, developing the selected portion, and then curing the selected portion at 100 to 200° C.

8. An electrostatic capacitance type touch panel comprising as peripheral wiring the conductive pattern according to claim 7, wherein the peripheral wiring has a pitch of 50 μm or less.

9. The conductive paste according to claim 2, further comprising a photopolymerization initiator (D).

10. The conductive paste according to claim 2, wherein the compound (B) has an unsaturated double bond.

11. The conductive paste according to claim 3, wherein the compound (B) has an unsaturated double bond.

12. The conductive paste according to claim 2, wherein acid value of the compound (B) is 40 to 250 mg KOH/g.

13. The conductive paste according to claim 3, wherein acid value of the compound (B) is 40 to 250 mg KOH/g.

14. The conductive paste according to claim 4, wherein acid value of the compound (B) is 40 to 250 mg KOH/g.

15. The conductive paste according to claim 1, wherein acid value of the compound (B) is 40 to 250 mg KOH/g.

* * * * *